United States Patent [19]
Gindrup et al.

[11] Patent Number: 5,786,785
[45] Date of Patent: Jul. 28, 1998

[54] ELECTROMAGNETIC RADIATION ABSORPTIVE COATING COMPOSITION CONTAINING METAL COATED MICROSPHERES

[75] Inventors: Wayne Laval Gindrup, Hickory; Rebecca Reeves Vinson, Conover, both of N.C.

[73] Assignee: Spectro Dynamics Systems, L.P., Hickory, N.C.

[21] Appl. No.: 933,829

[22] Filed: Nov. 24, 1986

Related U.S. Application Data

[63] Continuation-in-part of Ser. No. 612,622, May 21, 1984, Pat. No. 4,624,865, and a continuation-in-part of Ser. No. 702,684, Feb. 0, 1985, Pat. No. 4,624,798.

[51] Int. Cl.$^6$ .................................................. H01Q 07/00
[52] U.S. Cl. .................................................. 342/1
[58] Field of Search ............... 342/1, 3, 4; 343/912; 428/403

[56] References Cited

U.S. PATENT DOCUMENTS

| | | |
|---|---|---|
| Re. 29,039 | 11/1976 | Andrews . |
| 1,173,018 | 10/1916 | Dawson et al. ............... 342/4 |
| 2,864,774 | 12/1958 | Robinson . |
| 2,871,139 | 1/1959 | Wein . |
| 3,030,237 | 4/1962 | Price . |
| 3,365,315 | 1/1968 | Beck et al. . |
| 3,450,545 | 6/1969 | Ballard et al. . |
| 3,476,530 | 11/1969 | Ehrreich et al . |
| 3,573,230 | 3/1971 | Van Voorhees . |
| 3,699,050 | 10/1972 | Henderson . |
| 3,721,982 | 3/1973 | Wesch ............... 342/4 |
| 3,796,777 | 3/1974 | Netting . |
| 3,846,345 | 11/1974 | Mason et al. . |
| 3,859,087 | 1/1975 | Backstrom . |
| 3,946,372 | 3/1976 | Henry et al. . |
| 3,954,459 | 5/1976 | Schreiner et al. . |
| 3,988,651 | 10/1976 | Hertz . |
| 4,013,803 | 3/1977 | Josephs . |
| 4,098,945 | 7/1978 | Oehmke . |
| 4,115,325 | 9/1978 | Santala et al. . |
| 4,144,585 | 3/1979 | Puchalska-Hibner . |
| 4,147,668 | 4/1979 | Chiklis . |
| 4,150,173 | 4/1979 | Ziolo . |
| 4,158,031 | 6/1979 | Reuter et al. . |
| 4,197,218 | 4/1980 | McKaveney . |
| 4,199,614 | 4/1980 | Ziolo . |
| 4,233,191 | 11/1980 | Reuter et al. . |
| 4,412,942 | 11/1983 | Naarmann et al. . |
| 4,419,279 | 12/1983 | Abrams . |
| 4,434,541 | 3/1984 | Powers, Jr. . |
| 4,496,627 | 1/1985 | Azuma et al. . |
| 4,624,798 | 11/1986 | Gindrup et al. ............... 428/403 X |
| 4,624,865 | 11/1986 | Gindrup et al. ............... 428/403 X |

FOREIGN PATENT DOCUMENTS

| | | |
|---|---|---|
| 36940 | 10/1981 | European Pat. Off. . |
| 94106 | 11/1972 | Germany . |
| 3210770 | 9/1983 | Germany . |
| 542909 | 11/1973 | Switzerland . |

OTHER PUBLICATIONS

"Garnet Films for Micron and Submicron Magnetic Bubbles"; *Applied Physics*, vol. 24, No. 2, pp. 163–167, by D.J. Breed, et al; (1981).

"Conductive Thermoplastic Foam"; *IBM Technical Disclosure Bulletin*; vol. 19, No. 3, p. 1004; by E.G. Crosby, et al; (Aug. 1976).

"Manufacturing of Magnetic Bubble Film"; H. Seisakusho K.K. and Hitoshi Ikeda; Jan. 13, 1978; pp. 395–396.

"Effects of Particle Type on the Conductivity of Silvered Glass in Reinforced Composites"; Annual Technical Conference 1977—Reinforced Plastics/Composites Institute—The Society of Plastics Industry Inc.; by Richard E. Heinze and James R. Ritter; Section 8–D, pp. 1–3.

*Primary Examiner*—Mark Hellner
*Attorney, Agent, or Firm*—James W. Kayden, Esq.; Thomas, Kayden, Horstemeyer & Risley, LL

[57] ABSTRACT

A strong lightweight composition containing metal coated microspheres has very broad band absorption properties for electromagnetic radiation and is useful as a thin coating or as a structural composite material in various applications. The microspheres have a diameter of from 1 to 350 microns and contain at least one radiation absorbing material selected from the group consisting of carbon, ferrites, magnetite, iron, nickel and cobalt, and have a thin-coating of metal on the microsphere surface. The metal coating is present at a weight percentage of 0.01 percent to 22 percent.

21 Claims, No Drawings

ELECTROMAGNETIC RADIATION ABSORPTIVE COATING COMPOSITION CONTAINING METAL COATED MICROSPHERES

CROSS-REFERENCE TO RELATED APPLICATIONS

This application is a continuation-in-part of commonly owned co-pending application Ser. No. 612,622 filed May 21, 1984, now U.S. Pat. No. 4,624,865 granted Nov. 25, 1986, and a continuation-in-part of commonly owned co-pending application Ser. No. 702,684 filed Feb. 29, 1985, now U.S. Pat. No. 4,624,798, granted Nov. 25, 1986.

BACKGROUND OF THE INVENTION

The above-noted commonly owned and co-pending U.S. Pat. Nos. 4,624,798 and 4,624,865 disclose novel electrically conductive microparticles in the form of metal coated magnetic ceramic microspheres, methods for producing these microspheres, and also describe their usefulness in forming electrically conductive coatings or composites for various applications. We have now discovered that metal coated microspheres of the type described in the aforementioned patents can be used to form strong, very lightweight coatings and composites which absorb electromagnetic radiation.

A number of materials have been described in the prior art which are capable of absorbing electromagnetic radiation, and in particular, high frequency microwave radiation such as is used in radar. However, these materials have suffered certain undesirable properties and have been subject to significant limitations on their applicability and usefulness for many purposes. Absorptive materials which use iron powder, ferrites and other magnetic materials are quite heavy, which restricts their usefulness in applications requiring light weight, such as aircraft. Plastic foams containing carbon particles, metal powders and ferrites require a considerable thickness and are physically too weak for many applications. Resonant absorbers based on a resistive material one quarter wave length from a reflector are only effective at a very narrow frequency band. Broad band absorbers based on materials which have a relative magnetic permeability equal to the relative electrical permittivity typically contain ferrites, iron, and other high density materials which therefore result in very heavy absorbers.

Complex multi-layer arrangements of partially electrically conductive materials spaced with non-electrically conductive dielectrics to give a laminate with graded electrical properties have been prepared in the form of tiles with fair absorptive properties, but these are very difficult to apply to complex structures such as aircraft and suffer from a appreciable thickness and considerable weight.

The present invention provides a strong, lightweight composition containing metal coated microspheres. The composition has very broad band absorption properties for electromagnetic radiation and is effective when used as a thin coating or as a structural composite material. It can withstand very high temperatures (900 degrees C.) and is generally limited only by the binder in this respect. It has the added advantage of absorbing sound and is a good thermal insulator and may be easily applied to a substrate by conventional paint spray equipment.

SUMMARY OF THE INVENTION

The present invention, more particularly, provides an electromagnetic radiation absorptive composition which comprises microspheres having a diameter of from 1 to 350 microns, said microballoons containing at least one radiation absorbing material selected from the group consisting of carbon, ferrites, magnetite, iron, nickel and cobalt; and having a thin coating of metal on the microsphere surface, said metal coating being present at a percentage by weight of 0.01 percent to 22 percent.

Preferably, the microspheres comprise ceramic magnetic microspheres derived from the ash from coal fired furnaces, and these microspheres possess permanent magnetic properties.

The microspheres may be dispersed in and bound by an organic or inorganic binder, and utilized to form composite materials or coating compositions.

Additional features, advantages, and uses of the present invention will be understood more fully from the detailed description which follows.

DETAILED DESCRIPTION OF THE INVENTION

The term "microspheres" is understood by persons skilled in the art as referring to minute low density particles in the form of hollow or porous spheres formed of plastic, glass or ceramic. They are most commonly used as fillers in solid materials such as resins to form low density, high strength composite materials.

Certain grades of commercially available ceramic microspheres contain in the ceramic composition components such as carbon, ferrites, magnetite, iron, nickel and cobalt. These components give the microspheres magnetic properties.

I have found that ceramic magnetic microspheres with sizes ranging from about 1 to about 350 microns and which contain the aforementioned components in the ceramic composition, when coated with an extremely thin coating of conductive metal, will absorb broad band electromagnetic energy. This absorption is many orders of magnitude greater than that which would be expected from the content of the carbon, ferrite, metal traces and metal oxides found in the ceramic wall of the microsphere. I have also found that the best results are obtained when the metal coating is very uniform in thickness and so thin that appreciable light transmission occurs when the microspheres are examined microscopically.

Examples of commercially available ceramic microspheres having magnetic properties include Q-Cell grades 100, 110, 120 from the PQ Corporation, Valley Forge, Pa.; and Extendospheres XOL-200, CG, SG, SF-14 and others from PA Industries, Chattanooga, Tenn. These are lightweight, strong microspheres formed of a ceramic composition composed primarily of aluminum silicates, magnesium silicates, sodium silicates, or mixtures of these materials. The microspheres have a hollow ceramic shell, and are considerably stronger and more abrasion resistant than siliceous (glass) hollow microspheres. Ceramic microspheres, commercially called "centospheres" derived from the ash from industrial furnaces which burn powdered coal, are preferred, as these have the desirable compounds in sufficient amounts in the ceramic wall and are quite inexpensive. However, ceramic, glass or plastic microspheres may be made with the desirable compounds in the wall by techniques well known to the microsphere art. Such microspheres, when coated with a conductive metal as described herein, may be suitably employed in accordance with the present invention.

The coal-produced centospheres as obtained commercially typically contain from about 1 to about 15 percent by weight of carbon, ferrites, magnetite, iron, nickel and cobalt. The amount of these compounds in the ceramic composition will vary with the grade of coal burned such that some grades of centospheres will be higher in the desirable compounds than others.

For many applications it may be desirable to refine or enhance the magnetic properties of the commercially available microspheres. The more magnetic particles may be separated with a magnet from the less magnetic particles. Also, the permanent magnetic domains in the commercially available magnetic centospheres may be enhanced by heating those spheres slowly to avoid breakage to a point above the Curie Point, and then allowing the particles to cool in a strong magnetic field, thereby producing a strong permanent magnetic field orientation of the domains.

The microspheres are coated with a thin coating of an electrically conductive metal. While any conductive metal may be used, silver, gold, platinum, palladium and their alloys are preferred. The microspheres are plated with the metal using the procedures described in the aforementioned commonly owned co-pending applications, now U.S. Pat. Nos. 4,624,798 and 4,624,865. These procedures produce a very uniform bright mirror-like plating uniformly covering the surface of the microspheres. In order to have the desirable electromagnetic radiation absorptive properties, the metal coating should be quite thin and very uniform.

The metal coating is so thin that conventional techniques of thickness measurement are inadequate. I prefer to coat the microspheres with metal as a simple percentage by weight. The commercially available magnetic centospheres can be obtained in various size distributions, and the weight percentage of coating metal is dependent upon the size distribution of the particles. Typically, a material with an average diameter of 50 microns will require 2.0 percent to 3.0 percent by weight of coating metal. Smaller average diameter microspheres having a greater surface area per unit weight will require a higher weight percentage of metal coating, whereas larger average diameter material will require a lower weight percentage of coating metal. For microspheres having a diameter within the range from about 1 to about 350 microns will require a metal coating weight of from 0.01 percent to 22 percent by weight of the coated microspheres.

Measurement of the quality and quantity of the coating can be accomplished by measuring the electrical conductivity of the dried metal coated microspheres. This is accomplished by placing a small amount of the dried microspheres in a rectangular plastic tube having an internal open cross section of 1 cm.×1 cm. with allowance in the tube for close fitting silvered brass pistons electrically connected to an ohm meter. Weights may be placed on the apparatus to compress the material between the pistons. When an increase in weight does not change the resistance of the sample appreciably, this reading is taken. Since the height of the material in the tube is difficult to control, an exact weight, typically 0.05 grams of material is placed in the apparatus. Readings are taken until slight tamping and the addition of weight, usually totaling about 15 pounds, give stable readings. Metal coated microspheres having electromagnetic radiation absorptive properties typically range from 0.2 ohms to 200 ohms when measured by the above procedure, with the preferred range being 30 ohms to 40 ohms for absorption of electromagnetic radiation in the wave lengths used by radar. A sample of 0.05 grams of grade SF-20 microspheres (from P.A. Industries, Chattanooga, Tenn.) when coated with 2 percent by weight of silver will give a reading of about 34 ohms when properly prepared.

Blends of batches of material which differ from optimum may be made to fall within this range with good results if the silver percentage is within 0.2 percent for each component of the blend.

The metal coated microspheres may then be mixed with organic or inorganic binders to produce coating compositions or composite materials. When used in paint coatings, the microspheres to binder weight ratio may vary over wide percentages depending on the final physical performance desired. At low binder weights the coating is light in weight but is not as strong. At very high binder weights the coating is very tough but may contain insufficient microspheres to achieve good radar absorption. At weight ratios near 1 to 1, the microspheres enhance the strength of typical plastic binders such as urethanes, epoxies, or polyesters. This 1 to 1 ratio gives coatings with excellent physical and absorptive properties.

The paints may be sprayed in conventional paint apparatus to obtain coatings on any practical substrate. In general, the absorptive properties increase with the coating thickness. Typical results at 10 GHz would be −1 db for every 1 to 1½ mils of coating.

For best results the coating should be electrically isolated from an electrically conductive substrate by a coating of insulator material applied as a primer. The thickness of the primer and its electrical properties become less important as the thickness of the absorptive layer increases. The absorptive layer may be top coated to give a very tough and smooth final surface with any conventional coating which is radar transparent such as an acrylic, urethane, or epoxy.

The microspheres may be mixed with self-setting binders such as polyesters and epoxies or thermosetting binders such as phenolics and polyimides to produce very strong and lightweight composites. The microspheres typically have a density of 0.7 and the resulting composites usually have a density of less than 1. Composite structures such as radar absorbing shields are generally at least ⅛ inch thick and give very broad band strong radar absorption. The free-flowing to putty-like mixtures obtained before the binder sets are easily molded into complex shapes. Very strong and tough radar absorbing parts are produced with binder percentages ranging from 10 to 50 percent by weight.

Composite materials containing the electromagnetic absorptive microspheres can be mixed with various organic binders such as epoxies, polyesters, polyimides, resins, plastics, and silicones; or with inorganic binders such as silicates, clays, borates, aluminates and ceramics.

Coating compositions containing the microspheres can be used in various applications. For example, a cloth or netting can be given a coating containing the microspheres to thereby impart radar absorbing properties to the cloth or netting. A coating composition containing the microspheres can be applied to the surface of terrestrial vehicles such as automobiles; to water vehicles such as boats; to air vehicles such as airplanes, dirigibles and balloons; to space vehicles and to atmospheric re-entry vehicles. A cabinet or other housing for electronic apparatus may be coated with a paint coating or have composite walls containing the microspheres, to provide a highly effective electromagnetic frequency (EMF) shielding for the electronic apparatus. Wave guides and antennas for electromagnetic energy may be coated with a paint or formed from a composite material which contains the microspheres. A thermocouple may be coated with a coating containing the microspheres to provide an instrument for detecting electromagnetic radiation fields, since the electromagnetic energy received by the thermocouple will be absorbed, converted to heat, and thereby detected by the thermocouple. Containers for microwave cooking can be formed with the walls thereof containing or coated with a material containing the microspheres. A liquid containing the electromagnetic absorptive microspheres can be utilized in various applications, such as for example, as a liquid heat transfer medium capable of heating by microwave energy.

The following non-limiting examples are intended to further illustrate the properties and potential uses of materials containing the electromagnetic radiation absorptive microspheres of the invention.

EXAMPLE #1

Ceramic microspheres, Grade SF-20, were obtained from P. A. Industries, Chattanooga, Tenn. These were cleaned of dross and silvered by the method taught in U.S. Pat. No. 4,624,865. The final product was a dark grey powder consisting of a plating of 2 percent by weight of silver on the micropheres surface. This material was dried and mixed into a two component urethane paint such that when dried the urethane plastic to microsphere weights were in a ratio of 1 to 1. This paint was sprayed onto 6"×6"×0.055" polycarbonate panels to a thickness of 30 mils when dry and a coating weight of about 0.5 gram per square inch.

This panel exhibited an absorption exceeding the range of our apparatus (−20 db, less than 1/100 the normally reflected power) to measure when compared to a similar uncoated panel when placed in front of a metal reflector at which a 10 GHz. (X-band) radar apparatus was aimed.

EXAMPLE #2

A composite was prepared by mixing 2 percent weight silvered ceramic microspheres with 1/3 by weight premixed epoxy resin. The resulting putty-like material was rolled 1/8" thick onto a polyethylene sheet and allowed to cure 48 hours. This resulted in a very tough, lightweight, and strong composite sheet when removed from the polyethylene. This sheet also exceeded the dynamic range of our apparatus to measure at 10 GHz.

EXAMPLE #3

6 grams of ceramic microspheres having 2.20 percent silver were placed in a paper cup. The cup was placed in a commercial microwave oven (about 6 GHz) and irradiated for 15 seconds. The heat of absorption blackened and scorched the cup. Exposure for times slightly longer would set the cup on fire.

EXAMPLE #4

A very thin cotton cloth was coated by spraying with a mixture of flexible urethane paint and microspheres having 2.50 percent weight silver such that the resin solids to bead ratio was 3:2. The resulting cloth gave an absorption of X-band radar greater than −20 db when placed 0.050 inch from a reflective metal panel.

EXAMPLE #5

A polycarbonate panel 6"×6"×0.060" was coated with a paint prepared from microspheres silvered to 2.00 percent by weight and an amine cured epoxy resin. The final cured coating contained a microsphere to epoxy weight ratio of 3 to 2 and a cured thickness of 30 mils. This panel placed over a 100 percent reflective plate 6"×6" gave broad band absorption exceeding −15 db from 8 GHz to 16 GHz with most of the absorption exceeding −30 db.

That which we claim is:

1. An electromagnetic radiation absorptive composition which comprises an electromagnetic radiation nonabsorptive binder, and a plurality of electromagnetic radiation absorptive microspheres dispersed in said binder, said microspheres having a diameter from 1 to 350 microns, said microspheres containing at least one material selected from the group consisting of carbon, ferrites, magnetite, iron, nickel and cobalt; and having a thin coating of metal on the microsphere surface, said metal coating being present at a percentage by weight of 0.01 percent to 22 percent, and said coating being so thin that appreciable light transmission occurs when the microspheres are examined microscopically and so that the microspheres absorb electromagnetic radiation.

2. The composition according to claim 1 wherein said microspheres possess permanent magnetic properties.

3. The composition according to claim 1 wherein said microspheres comprise ceramic magnetic microspheres derived from the ash from coal-fired furnaces.

4. The composition according to claim 1 wherein said thin metal coating comprises a metal chosen from the group consisting of silver, gold, tin, chromium, platinum, palladium, nickel, copper, and cadmium and alloys of these metals, and wherein said plating is in the form of a bright mirror-like plating uniformly covering the surface of said microspheres.

5. A composition according to claim 1 wherein the metal coating on said microspheres is of such a thickness as to provide a resistivity of from 0.2 ohms to 200 ohms.

6. The composition according to claim 1 wherein said microspheres have an average diameter of about 50 microns and said metal coating is present at a level of about 2 to 3 percent by weight.

7. An electromagnetic radiation absorptive composite material which comprises the microspheres of claim 1 dispersed in and bound by an organic or inorganic binder.

8. An electromagnetic radiation absorptive coating which comprises the microspheres of claim 1 mixed with an organic or inorganic binder and forming a coating on a substrate.

9. A fabric having a coating containing the microspheres as defined in claim 1 imparting electromagnetic radiation absorptive properties to the fabric.

10. A paint coating containing the microspheres as defined in claim 1 imparting electromagnetic radiation absorptive properties to the paint.

11. A laminate containing at least one layer which contains the microspheres as defined in claim 1.

12. An electromagnetic radiation absorptive composition which comprises an electromagnetic radiation nonabsorptive binder; and a multiplicity of electromagnetic radiation absorptive microspheres dispersed in said binder, said microspheres having a diameter of from 1 to 350 microns and containing at least one material selected from the group consisting of carbon, ferrites, magnetite, iron, nickel and cobalt, said microspheres having a bright mirror-like metal plating uniformly covering the microspheres surface, said metal plating being present at a percentage by weight of 0.01 to 22 percent and being of such a thickness as to provide a resistivity of from 0.2 ohms to 200 ohms.

13. A structure which absorbs electromagnetic radiation comprising an electrically conductive substrate, an insulating coating of an electrically insulating material overlying said substrate, and an electromagnetic radiation absorptive coating overlying said insulating coating, said electromagnetic radiation absorptive coating comprising a binder and a multiplicity of microspheres dispersed in and bound by said binder, said microspheres having a diameter of from 1 to 350 microns and containing at least one radiation absorptive material selected from the group consisting of carbon, ferrites, magnetite, iron, nickel and cobalt; and having a thin radiation absorbing metal plating on the microsphere surface, said metal plating being present at a percentage by weight of 0.01 percent to 22 percent.

14. A structure as defined in claim 13 additionally including a top coating of a composition which is non-absorptive to electromagnetic radiation overlying said electromagnetic radiation absorptive coating and defining the outermost surface of said structure.

15. A terrestrial vehicle having a coating as defined in claim 13.

16. An air vehicle having a coating as defined in claim 13.

17. A space vehicle having a coating as defined in claim 13.

18. A water vehicle having a coating as defined in claim 13.

19. A atmospheric re-entry vehicle having a coating as defined in claim 13.

20. A radar antenna including a coating as defined in claim 13.

21. A projectile having a coating as defined in claim 13.

* * * * *